US008922114B2

(12) United States Patent
Lee et al.

(10) Patent No.: US 8,922,114 B2
(45) Date of Patent: Dec. 30, 2014

(54) WHITE LIGHT-EMITTING DEVICE, WHITE LIGHT-EMITTING PANEL INCLUDING THE SAME, METHOD OF MANUFACTURING WHITE LIGHT-EMITTING PANEL, AND DISPLAY APPARATUS INCLUDING WHITE LIGHT-EMITTING DEVICE

(71) Applicant: Samsung Display Co., Ltd., Yongin (KR)

(72) Inventors: Min-Woo Lee, Yongin (KE); Young-Mo Koo, Yongin (KR); Jae-Goo Lee, Yongin (KR); Woo-Sik Jeon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/797,098

(22) Filed: Mar. 12, 2013

(65) Prior Publication Data

US 2014/0084784 A1 Mar. 27, 2014

(30) Foreign Application Priority Data

Sep. 24, 2012 (KR) .......................... 10-2012-0105951

(51) Int. Cl.

| | |
|---|---|
| *H01J 1/62* | (2006.01) |
| *H01J 63/04* | (2006.01) |
| *H01L 27/32* | (2006.01) |
| *H05B 33/10* | (2006.01) |
| *H05B 33/12* | (2006.01) |
| *H01L 51/52* | (2006.01) |

(52) U.S. Cl.
CPC .............. *H05B 33/12* (2013.01); *H01L 27/322* (2013.01); *H05B 33/10* (2013.01); *H01L 51/5284* (2013.01); *H01L 27/3246* (2013.01); *H01L 27/3279* (2013.01); *H01L 51/5271* (2013.01)
USPC ................ 313/504; 313/506; 445/23; 445/24

(58) Field of Classification Search
CPC .............. H01L 27/322; H01L 27/3246; H01L 27/3279; H01L 51/5271; H01L 51/5284; H05B 33/10; H05B 33/12
USPC ............................... 313/504, 506; 445/23, 24
See application file for complete search history.

(56) References Cited

U.S. PATENT DOCUMENTS 5,294,870 A * 3/1994 Tang et al. ..................... 313/504
5,909,081 A * 6/1999 Eida et al. ...................... 313/504

(Continued)

FOREIGN PATENT DOCUMENTS

| | | |
|---|---|---|
| JP | 2007-067420 | 3/2007 |
| JP | 2008-010556 | 1/2008 |

(Continued)

*Primary Examiner* — Thomas A Hollweg
(74) *Attorney, Agent, or Firm* — Christie, Parker & Hale, LLP

(57) ABSTRACT

A white light-emitting device includes a first electrode; a first barrier rib on the first electrode including a first color conversion material; a second barrier rib on the first electrode spaced apart from the first barrier rib and including a second color conversion material; a third color layer between the first barrier rib and the second barrier rib that emits white light when light emitted from the third color layer is combined with light emitted from first color conversion material and light emitted from the second color conversion material; and a second electrode on the first barrier rib, the second barrier rib, and the third color layer.

22 Claims, 7 Drawing Sheets

(56) References Cited

U.S. PATENT DOCUMENTS

| | | | |
|---|---|---|---|
| 7,233,104 B2* | 6/2007 | Kuma et al. | 313/501 |
| 7,489,075 B2* | 2/2009 | Lee | 313/506 |
| 7,583,021 B2* | 9/2009 | Mikami et al. | 313/504 |
| 7,772,763 B2* | 8/2010 | Bae et al. | 313/505 |
| 7,994,705 B2* | 8/2011 | Hosokawa | 313/504 |
| 2005/0040754 A1* | 2/2005 | Sakurai | 313/500 |
| 2006/0097631 A1* | 5/2006 | Lee | 313/504 |
| 2006/0119259 A1* | 6/2006 | Bae et al. | 313/506 |
| 2006/0244372 A1* | 11/2006 | Mikami et al. | 313/506 |
| 2006/0284204 A1* | 12/2006 | Yamazaki et al. | 257/98 |
| 2007/0045761 A1 | 3/2007 | Basin et al. | |
| 2011/0304804 A1 | 12/2011 | Lee et al. | |

FOREIGN PATENT DOCUMENTS

| | | |
|---|---|---|
| JP | 2011-257730 | 12/2011 |
| KR | 10-2002-0007709 A | 1/2002 |

\* cited by examiner

WHITE LIGHT-EMITTING DEVICE, WHITE LIGHT-EMITTING PANEL INCLUDING THE SAME, METHOD OF MANUFACTURING WHITE LIGHT-EMITTING PANEL, AND DISPLAY APPARATUS INCLUDING WHITE LIGHT-EMITTING DEVICE

CROSS-REFERENCE TO RELATED PATENT APPLICATION

This application claims priority to and the benefit of Korean Patent Application No. 10-2012-0105951, filed on Sep. 24, 2012 in the Korean Intellectual Property Office, the entire content of which is incorporated herein by reference.

BACKGROUND

1. Field of the Invention

The present invention relates to a white light-emitting device, a white light-emitting panel including the white light-emitting device, a method of manufacturing the white light-emitting panel, and a display apparatus including the white light-emitting device.

2. Description of the Related Art

Recently, illumination apparatuses or full-color display apparatuses using organic light-emitting devices have been widely manufactured. As compared with inorganic light-emitting devices, organic light-emitting devices have good properties, such as low driving voltage, low power consumption, and generation of multi-colored images.

SUMMARY

According to an embodiment of the present invention, a white light-emitting device includes a first electrode; a first barrier rib on the first electrode, the first barrier rib including a first color conversion material; a second barrier rib spaced apart from the first barrier rib on the first electrode, the second barrier rib including a second color conversion material; a third color layer between the first barrier rib and the second barrier rib that emits white light when light emitted from the first and second color conversion materials and light emitted from the third color layer are combined with each other; and a second electrode on the first barrier rib, the second barrier rib, and the third color layer.

The first color conversion material and the second color conversion material may absorb light emitted from the third color layer and emit light having a different wavelength range from that of the light emitted from the third color layer.

The first color conversion material and the second color conversion material may emit light having different wavelength ranges.

At least one of the first color conversion material, the second color conversion material, and the third color layer may include an organic light-emitting material.

The third color layer may emit light having a wavelength range of about 400 nm to about 500 nm.

The first color conversion material may emit light having a wavelength range of about 450 nm to about 600 nm when absorbing light emitted from the third color layer.

The second color conversion material may emit light having a wavelength range of about 600 nm to about 700 nm when absorbing light emitted from the third color layer.

The first barrier rib may be formed of an insulating resin binder combined with the first color conversion material, and the second barrier rib may be formed of an insulating resin binder combined with the second color conversion material.

The white light-emitting device may further include an auxiliary electrode that is formed in the first barrier rib and the second barrier rib and that is connected to the first electrode.

The auxiliary electrode may include a material having lower resistance than that of the first electrode.

The auxiliary electrode may include a dispersive metal particle.

The auxiliary electrode may be surrounded by the first barrier rib and the second barrier rib so as to be insulated from the second electrode.

According to another embodiment of the present invention, a white light-emitting panel includes at least one white light-emitting device between a first substrate and a second substrate, where a plurality of the first electrodes are formed in a plurality of patterns spaced apart from each other.

According to another aspect of the present invention, a method of manufacturing a white light-emitting panel includes forming a first electrode on a first substrate; forming a first barrier rib and a second barrier rib on the first electrode, where the first barrier rib includes a first color conversion material and the second barrier rib includes a second color conversion material; forming a third color layer between the first and second barrier ribs, where the third color layer emits white light when light emitted from third color layer combines with light emitted from the first and second color conversion materials; and forming a second electrode on the first barrier rib, the second barrier rib, and the third color layer.

The forming of the first electrode may include printing etching pastes in a plurality of patterns spaced apart from each other on the substrate, forming a conductive layer between the printing etching pastes, and then etching the printing etching pastes to form a plurality of first electrodes in a plurality of patterns spaced apart from each other.

The forming of the first barrier rib may include printing materials obtained by mixing the first color conversion material with an insulating resin binder, and the forming of the second barrier rib may include printing materials obtained by mixing the second color conversion material with an insulating resin binder.

The first and second barrier ribs may be formed such that the first and second color conversion materials absorb light emitted from the third color layer and emit light having a different wavelength range from that of the light emitted from the third color layer.

The method may further include, prior to the forming of the first barrier rib and the second barrier rib, forming an auxiliary electrode on the first electrode, where the first barrier rib and the second barrier rib may cover the auxiliary electrode.

The auxiliary electrode may be formed by printing a paste including a dispersive metal particle.

At least one of the first color conversion material, the second color conversion material, and the third color layer may include an organic light-emitting material.

According to another embodiment of the present invention, there is provided a display apparatus including at least one white light-emitting device between a first substrate and a second substrate; and a plurality of color conversion regions on one surface of at least one of the first substrate and the second substrate that convert white light emitted from the white light-emitting device into at least two colors.

The first electrode may be formed in a plurality of stripes that extend in a first direction, the second electrode may be formed in a plurality of stripes that extend in a second direction that intersects the first direction, and the white light-emitting device may be driven using a passive matrix method.

A plurality of the first electrodes may be formed in island patterns connected to thin film transistors on respective pixels, the second electrode may be formed as a common electrode formed on a plurality of pixels, and the white light-emitting device may be driven using an active matrix method.

At least one of the first color conversion material, the second color conversion material, and the third color layer may include an organic light-emitting material.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

Figure 1:
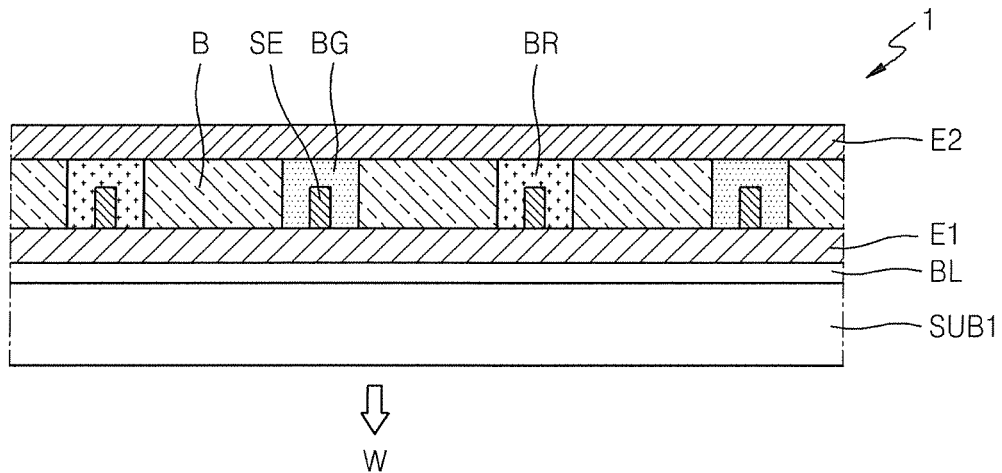
FIG. 1 is a cross-sectional view of a white light-emitting device according to an embodiment of the present invention.

In the following detailed description, certain exemplary embodiments of the present invention have been shown and described, simply by way of illustration. As those skilled in the art would realize, the described embodiments may be modified in various different ways without departing from the spirit or scope of the present invention.

Accordingly, the drawings and description are to be regarded as illustrative in nature and not restrictive. Like reference numerals designate like elements throughout the specification.

In various embodiments, elements having the same construction are designated with the same reference numeral as used in the representative description in the first embodiment, and only constructions that are different from that described in the first embodiment are described in the subsequent embodiments.

Sizes and thicknesses of the elements shown in the drawings are for the purpose of descriptive convenience, and thus the present invention is not necessarily limited thereto.

Thicknesses of layers and regions are expanded in the drawings for clarity. For example, for descriptive convenience, the thicknesses of some layers and regions are exaggerated in the drawings. When an element such as a layer, a film, a region, and a board is referred to as being "on" another element, the element can be directly on another element or intervening elements may be present, unless otherwise indicated.

Throughout this specification, unless explicitly described to the contrary, the word "comprise" and variations such as "comprises" or "comprising", will be understood to imply the inclusion of stated elements but not the exclusion of any other elements. Further, throughout this specification, the term "above" encompasses both an orientation of above and below and does not necessarily encompass the orientation of above with respect to a direction of gravity.

Expressions such as "at least one of," when preceding a list of elements, modify the entire list of elements and do not modify the individual elements of the list.

Hereinafter, a white light-emitting device will be described with regard to a first embodiment of the invention with reference to FIG. 1.

FIG. 1 is a cross-sectional view of a white light-emitting device 1 according to a first embodiment of the present invention.

Referring to FIG. 1, the white light-emitting device 1 includes first barrier ribs BR including a first color conversion material, second barrier ribs BG including a second color conversion material, and a third color layer B between the first barrier ribs BR and second barrier ribs BG, where the first barrier ribs BR, the second barrier ribs BG, and the third color layer B are disposed between a first electrode E1 and a second electrode E2.

Here, the first color conversion material and the second color conversion material absorb light emitted from the third color layer B and emit light having a different wavelength range from the light emitted from the third color layer B. The light emitted from the first color conversion material and the second color conversion material, and the light emitted from the third color layer B are combined such that the white light-emitting device 1 may emit white light (W) as a whole.

An example of the combination of the light emitted from the first color conversion material, the light emitted from second color conversion material, and the light emitted from the third color layer B that yields emission of white light (W) as a whole includes a combination of red light, green light, and blue light. However, the present invention is not limited thereto, and any combination of light rays may be used as long as the light rays may be combined to emit white light W. Hereinafter, a case in which the light emitted from the third color layer B is blue light, the light emitted from the first color conversion material is red light, and the light emitted from the second color conversion material is green light will be described.

When a predetermined voltage is applied to the first electrode E1 and the second electrode E2, the third color layer B emits blue light having a wavelength range from about 400 nm to about 500 nm.

The third color layer B emitting blue light may include an organic material and may include one material selected from DPVBi, spiro-DPVBi, spiro-6P, distyrylbenzene (DSB), distyrylaryene (DSA), a PFO-based polymer, or a PPV-based polymer.

The blue light emitted from the third color layer B may be absorbed in the first color conversion material included in the first barrier ribs BR, and the first color conversion material may emit red light having a wavelength range of about 450 nm to about 600 nm.

The first color conversion material emitting red light may include an organic material, for example, the first color conversion material may include carbazole biphenyl (CBP) or mCP as a host material, and may include a phosphorescent material including at least one selected from PIQIr(acac)(bis (1-phenylisoquinoline)acetylacetonate iridium), PQIr(acac) (bis(1-phenylquinoline)acetylacetonate iridium), or platinum-octaethyl-porphyrin (PtOEP) as a dopant material. Alternatively, the first color conversion material may include a fluorescent material such as PED:Eu(DBM)3(Phen) or perylene.

The blue light emitted from the third color layer B is absorbed in the second color conversion material included in the second barrier ribs BG, and the second color conversion material may emit green light having a wavelength range of about 600 nm to about 700 nm.

The second color conversion material emitting green light may include an organic material, for example, the second color conversion material may include CBP or mCP as a host material, and may include a phosphorescent material including Ir(ppy)3 (fac tris(2-phenylpyridine) iridium) as a dopant material. Alternatively, the second color conversion material may include a fluorescent material such as Alq3(tris(8-hydroxyquinoline) aluminum).

The first barrier ribs BR and the second barrier ribs BG may be formed with predetermined thicknesses between the first electrode E1 and the second electrode E2, and may be formed of an insulating material such that the first electrode E1 and the second electrode E2 do not electrically connect to each other. For example, the first barrier ribs BR may be formed of a material obtained by mixing the first color conversion material with an insulating acryl binder in a ratio of about 1:9 to about 9:1. Similarly, the second barrier ribs BG may be formed of a material obtained by mixing the second color conversion material with an insulating acryl binder in a ratio of about 1:9 to about 9:1.

According to the present embodiment, when a predetermined voltage is applied to the first electrode E1 and the second electrode E2 of the white light-emitting device 1, the third color layer B emits blue light that is absorbed in the first color conversion material and the second color conversion material the first and second barrier ribs BR and BG, respectively, which are adjacent to the third color layer B. Then, the first color conversion material emits red light, and the second color conversion material emits green light. Thus, the red light and the green light are combined with the blue light emitted from the third color layer B such that the white light-emitting device 1 may emit white light (W) as a whole.

At least one of the first electrode E1 and the second electrode E2 may be an electrode through which light is transmitted. Depending on the direction in which the light is transmitted, the white light-emitting device 1 may be configured as a bottom emission type light-emitting device for emitting light toward a first substrate SUB1, a top emission type light-emitting device for emitting light in a direction opposite to the first substrate SUB1, and a dual emission type light-emitting device for emitting light in both directions.

According to the present embodiment, the first electrode E1 may be formed as a transparent electrode including a material selected from ITO, IZO, ZnO, $In_2O_3$, IGO, or AZO, and the second electrode E2 may be formed as a reflective electrode including a material selected from silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). Thus, the white light-emitting device 1 may be a bottom emission type light-emitting device for emitting light toward the first substrate SUB1. However, the present invention is not limited thereto. Alternatively, the white light-emitting device 1 may be a top emission type light-emitting device or a dual emission type light-emitting device.

The first substrate SUB1 may be formed of a glass material including $SiO_2$ as a main component. The first substrate SUB1 is not limited thereto, and thus, may be formed of a transparent plastic material.

A buffer layer BL may be further formed on the first substrate SUB1 to prevent impurities from penetrating into the first substrate SUB1 and to planarize the first substrate SUB1.

According to the present embodiment, auxiliary electrodes SE connected to the first electrode E1 may be further respectively included in the first barrier ribs BR and the second barrier ribs BG. The auxiliary electrodes SE may include a metal having a lower resistance than that of the first electrode E1 to prevent a drop in voltage due to the first electrode E1.

The auxiliary electrodes SE may include a dispersive metal particle such as silver (Ag). The dispersive metal particle may disperse light emitted from the white light-emitting device 1 to further increase luminescent efficiency.

According to the present embodiment, the first barrier ribs BR (including the first color conversion material) and the second barrier ribs BG (including the second color conversion material) may be disposed adjacent to two lateral surfaces of the third color layer B emitting blue light. The white light-emitting device 1 may have a simpler structure than that of a white light-emitting device that separately includes a blue light-emitting diode (LED) device and a color conversion layer. In addition, the auxiliary electrodes SE may be respectively included in the first barrier ribs BR and the second barrier ribs BG to prevent a drop in voltage, to increase power efficiency, and to increase luminescent efficiency due to a dispersive effect of the auxiliary electrodes SE.

Hereinafter, a white light-emitting device will be described with regard to a second embodiment of the invention with reference to FIG. 2.

Figure 2:
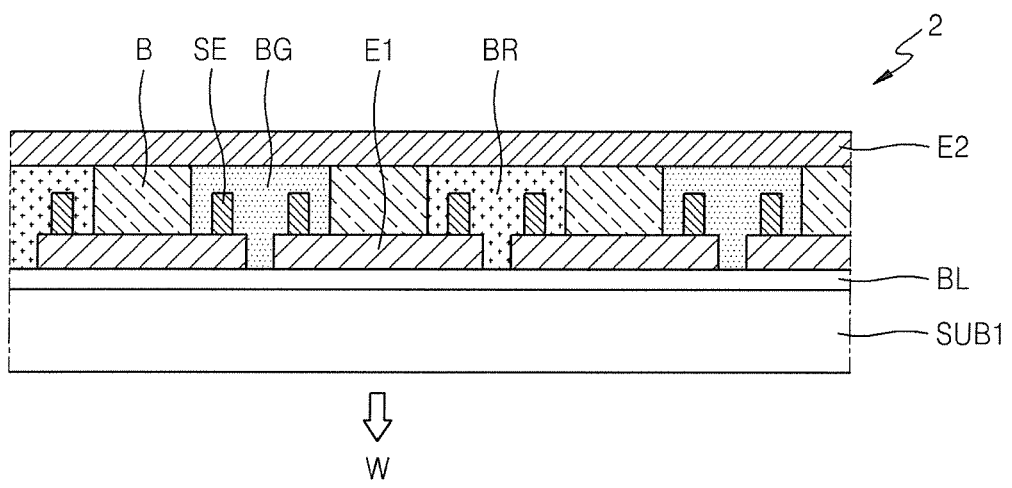
FIG. 2 is a cross-sectional view of a white light-emitting panel according to another embodiment of the present invention.

FIG. 2 is a cross-sectional view of a white light-emitting panel 2 according to a second embodiment of the present invention.

Referring to FIG. 2, the white light-emitting panel 2 includes: a plurality of first electrodes E1 that are formed in patterns spaced apart from each other on the first substrate SUB1; the first barrier ribs BR including the first color conversion material; the second barrier ribs BG including the second color conversion material; and the third color layer B disposed between the first barrier ribs BR and the second barrier ribs BG. The first barrier ribs BR, the second barrier ribs BG, and the third color layer B are disposed between the first electrodes E1 and the second electrode E2.

According to the first embodiment of the present invention, the white light-emitting device 1 uses a point light source as a single device. However, according to the second embodiment of the present invention, the white light-emitting panel 2 may use a surface light source. The white light-emitting panel 2 according to the present embodiment may be configured such that the plurality of first electrodes E1 may be formed in patterns that are spaced apart from each other so as to change a voltage applied to each white light-emitting device, or the areas of the first electrodes E1 may be changed to change the blue light-emitting region. Thus, the white light-emitting panel 2 may be a color variable illumination panel.

FIG. 2 shows a case where the first barrier ribs BR and the second barrier ribs BG are each formed across two sides of adjacent first electrodes E1. However, the present invention is not limited thereto.

Hereinafter, a method of manufacturing a white light-emitting panel will be described with reference to FIGS. 3A through 3H.

FIGS. 3A through 3H are schematic cross-sectional views of the white light-emitting panel of FIG. 2 at various stages in a method of manufacturing the white light-emitting panel 2 according to an embodiment of the present invention.

Figure 3A:
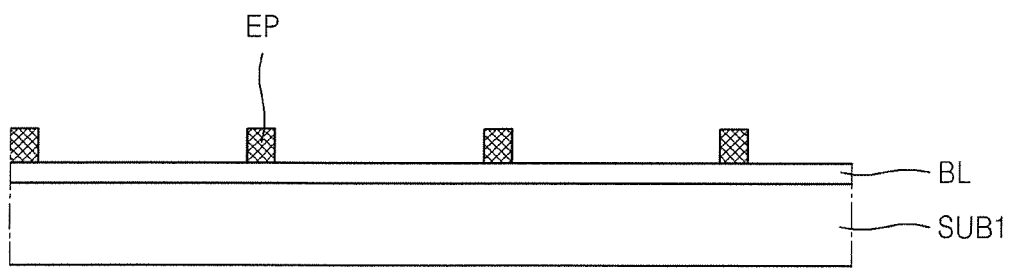
FIGS. 3A through 3H are schematic cross-sectional views of the white-light emitting panel of FIG. 2 at various stages in a method of manufacturing the white light-emitting panel according to an embodiment of the present invention.

Referring to FIG. 3A, the first substrate SUB1 is prepared. Then, the buffer layer BL is formed on the first substrate SUB1.

Printing etching pastes EP are printed in a plurality of patterns that are spaced apart from each other on the buffer layer BL.

Figure 3B:
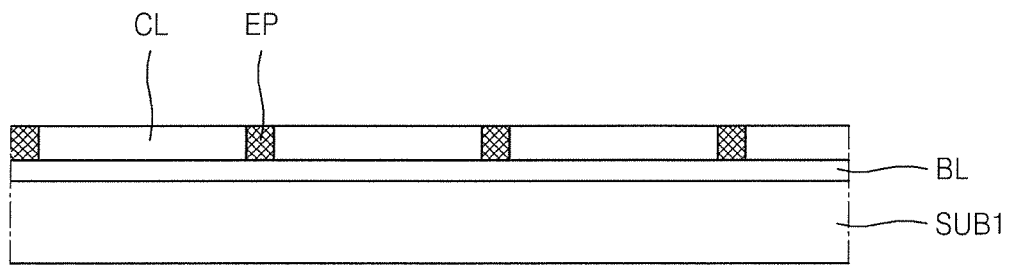

Referring to FIG. 3B, conductive layers CL may be formed in patterns that are spaced apart from each other between the printing etching pastes EP. The conductive layers CL may include a material selected from ITO, IZO, ZnO, $In_2O_3$, IGO, or AZO.

Figure 3C:
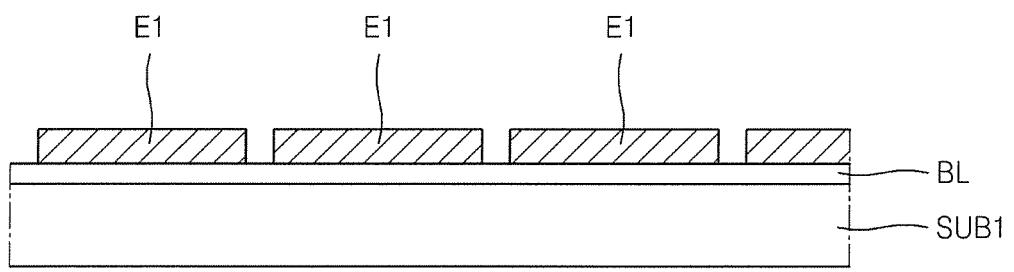

Referring to FIG. 3C, the printing etching pastes EP are etched away by applying heat to form a plurality of first electrodes E1 from the conductive layers CL that are spaced apart on the buffer layer BL. Although not shown in FIG. 3C, a washing process may be further performed.

Figure 3D:
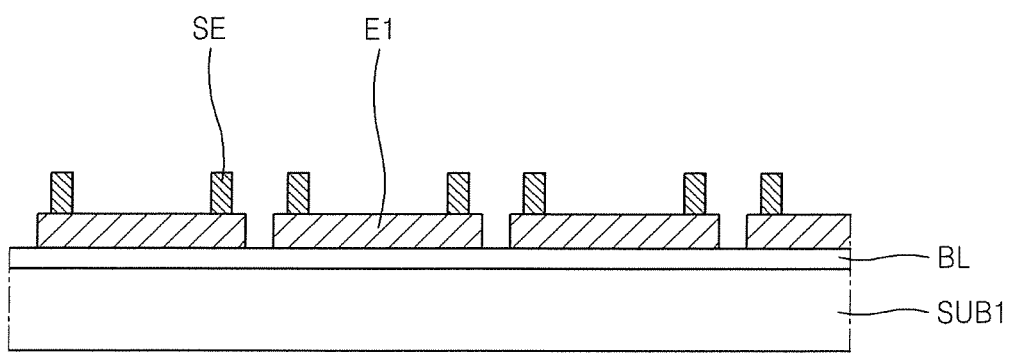

Referring to FIG. 3D, the auxiliary electrodes SE are formed on the first electrodes E1. The auxiliary electrodes SE may be formed of a metal having a lower resistance than that of the first electrodes E1.

The auxiliary electrodes SE may include a dispersive metal particle such as silver (Ag). The auxiliary electrodes SE may be formed by printing a paste including the dispersive metal particles. Although not shown in FIG. 3D, appropriate firing and washing processes may be further performed.

Figure 3E:
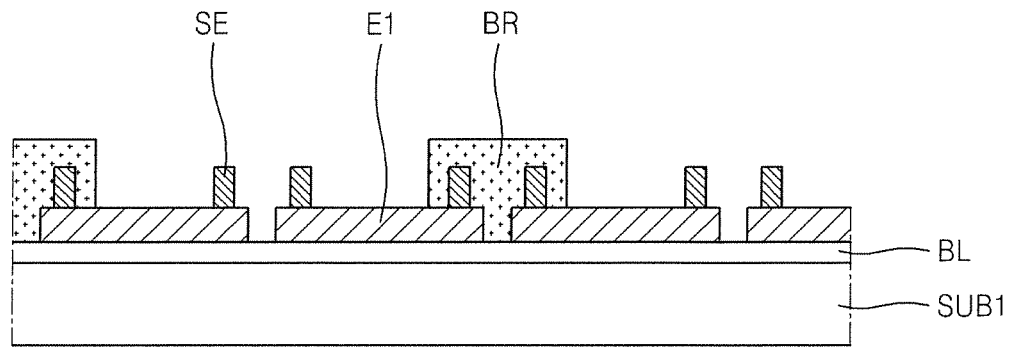

Referring to FIG. 3E, the first barrier ribs BR (including the first color conversion material) are formed on the first electrodes E1 so as to cover the auxiliary electrodes SE.

The first color conversion material may include an organic material that absorbs blue light and emits red light, for example, the first color conversion material may include CBP or mCP as a host material, and may include a phosphorescent material including at least one selected from PIQIr(acac)(bis (1-phenylisoquinoline)acetylacetonate iridium), PQIr(acac (bis(1-phenylquinoline)acetylacetonate iridium), PQIr(tris (1-phenylquinoline) iridium), or PtOEP as a dopant material. Alternatively, the first color conversion material may include a fluorescent material, such as PED:Eu(DBM)3(Phen) or perylene.

The first barrier ribs BR may be formed by printing a material obtained by mixing the first color conversion material with an insulating resin binder, such as acryl resin, in a ratio of about 1:9 to about 9:1. Although not shown in FIG. 3E, a hardening process and a washing process may be further performed.

Figure 3F:
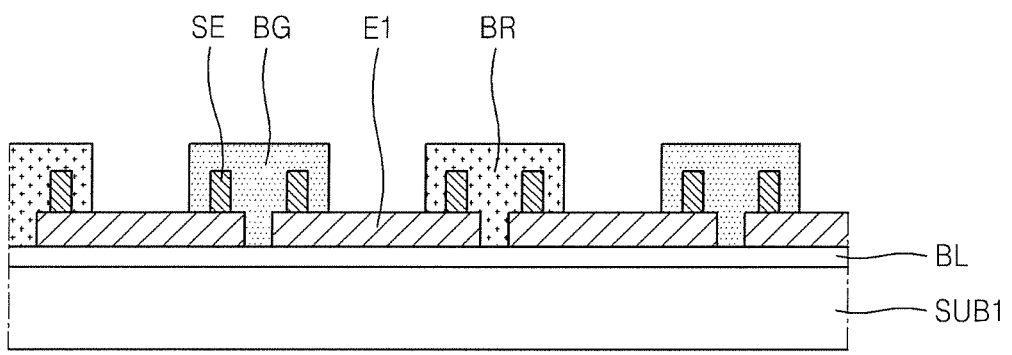

Referring to FIG. 3F, the second barrier ribs BG (including the second color conversion material) are formed on the first electrode E1 so as to cover the auxiliary electrodes SE.

The second color conversion material may include an organic material that absorbs blue light and emits green light, for example, the second color conversion material may include CBP or mCP as a host material, and may include a phosphorescent material including Ir(ppy)3 (fac tris(2-phenylpyridine) iridium) as a dopant material. Alternatively, the second color conversion material may include a fluorescent material such as Alq3(tris(8-hydroxyquinoline) aluminum).

The second barrier ribs BG may be formed by printing a material obtained by mixing the second color conversion material with an insulating resin binder, such as acryl resin, in a ratio of about 1:9 to about 9:1. Although not shown in FIG. 3F, a hardening process and a washing process may be further performed.

The process for forming the first barrier ribs BR and the process for forming the second barrier ribs BG may be reversed or may be simultaneously performed.

Figure 3G:
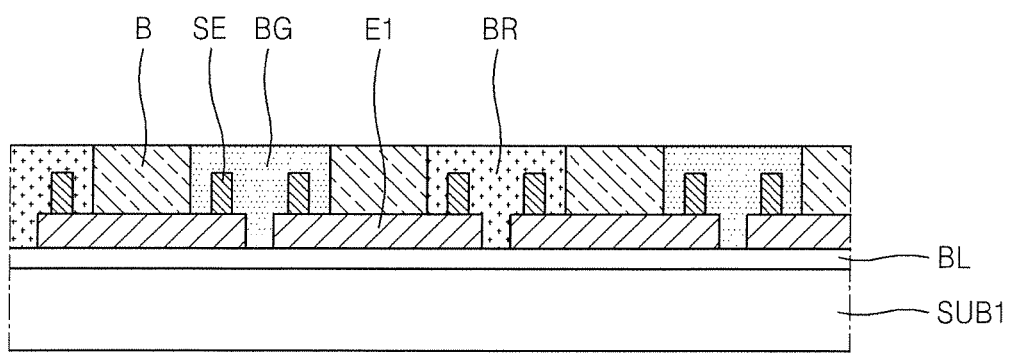

Referring to FIG. 3G, the third color layer B is formed between the first barrier ribs BR and the second barrier ribs BG. The third color layer B may be formed by various methods, such as deposition, printing, light and heat transfer, or the like.

The third color layer B may include an organic material emitting blue light, for example, the third color layer B may include a material selected from DPVBi, spiro-DPVBi, spiro-6P, DSB, DSA, a PFO-based polymer, or a PPV-based polymer.

Light emitted from the third color layer B and light emitted from the first color conversion material and the second color conversion material combine with each other to emit white light.

Figure 3H:
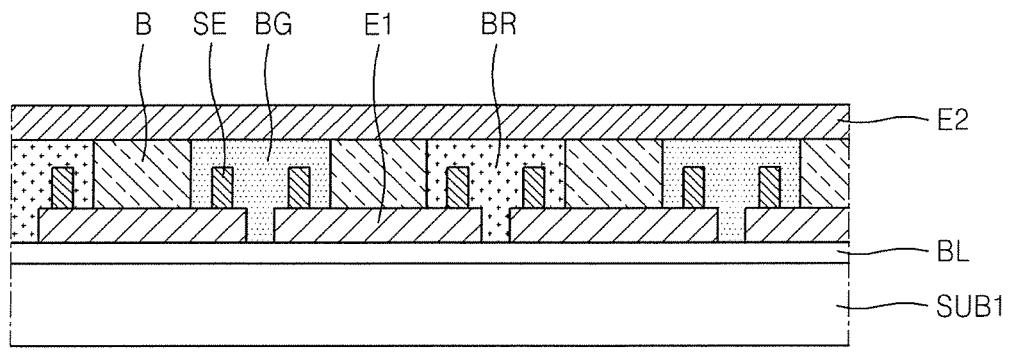

Referring to FIG. 3H, the second electrode E2 is formed on the first barrier ribs BR, the second barrier ribs BG, and the third color layer B. When voltage is applied to the first electrodes E1 and the second electrode E2, the third color layer B emits blue light. Then, the blue light is absorbed in the first color conversion material and the second color conversion material of the first barrier ribs BR and the second barrier ribs BG, which are adjacent to the third color layer B, and then the light is combined with the red light and the green light respectively emitted from the first color conversion material and the second color conversion material to emit white light.

According to the above-described manufacturing method, the white light-emitting panel 2 may be manufactured by printing (and not deposition) the first electrodes E1, the first barrier ribs BR, and the second barrier ribs BG, thereby simplifying the manufacturing process, which reduces manufacturing time and cost.

Hereinafter, a full-color display apparatus will be described with regard to a third embodiment of the present invention with reference to FIGS. 4 and 5.

Figure 4:
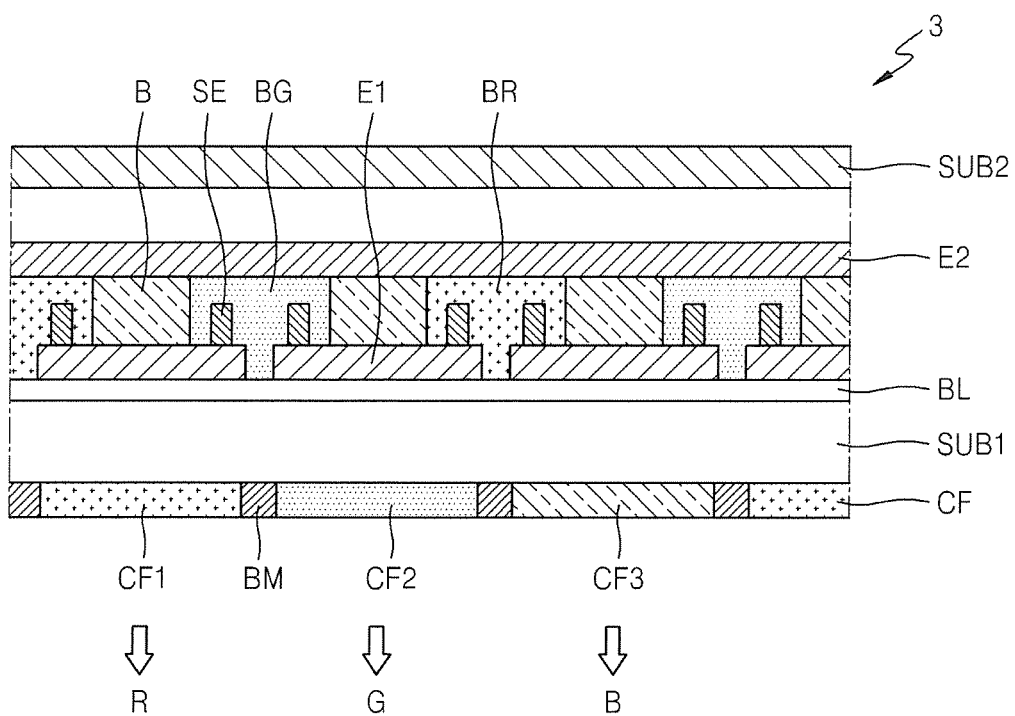
FIG. 4 is a cross-sectional view of a full-color display apparatus using a passive matrix driving method, according to another embodiment of the present invention.

FIG. 4 is a cross-sectional view of a full-color display apparatus 3 using a passive matrix driving method, according to a third embodiment of the present invention. FIG. 5 is a cross-sectional view of a portion of the full-color display apparatus 3 of FIG. 4.

Figure 5:
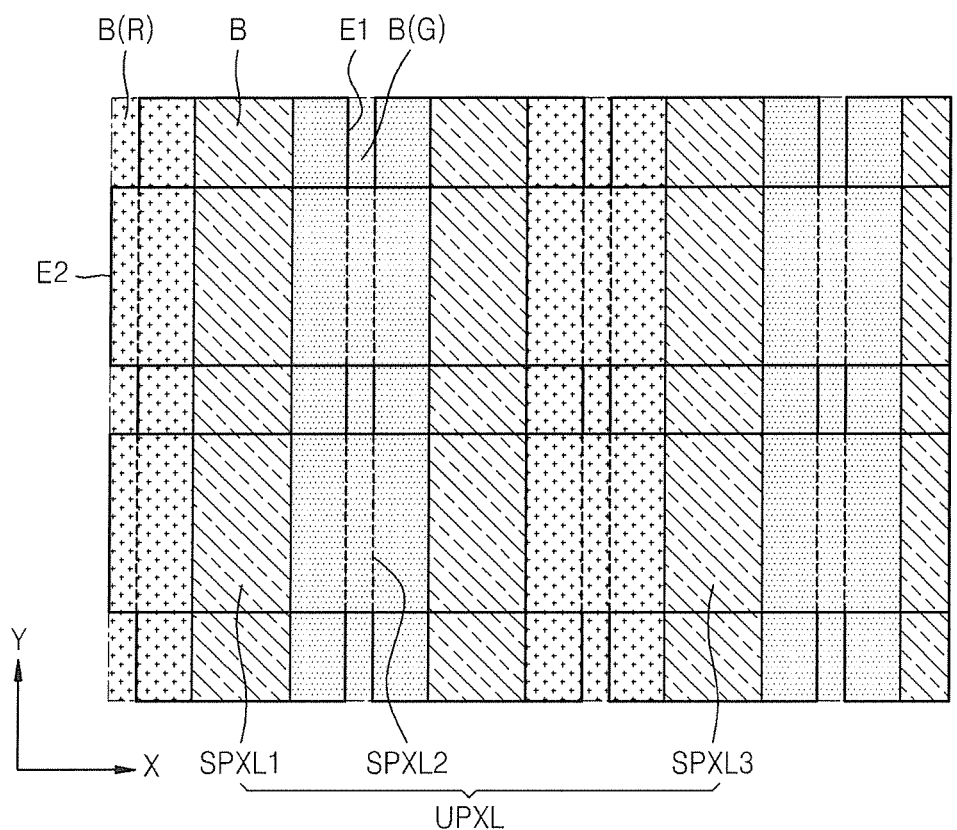
FIG. 5 is a cross-sectional view of a portion of the full-color display apparatus of FIG. 4.

Referring to FIGS. 4 and 5, the buffer layer BL is formed on the first substrate SUB1. In addition, a plurality of first electrodes E1 extend in a first direction Y on the buffer layer BL and are formed in stripe patterns that are spaced apart from each other.

A plurality of second electrodes E2 extend in a second direction X that intersects the first direction Y, and are formed in stripe patterns that are spaced apart from each other.

The first barrier ribs BR (including the first color conversion material), the second barrier ribs BG (including the second color conversion material), and the third color layer B between the first barrier ribs BR and the second barrier ribs BG are formed between the first electrodes E1 and the second electrodes E2.

The auxiliary electrodes SE may be formed in the first barrier ribs BR and the second barrier ribs BG.

In addition, color filters CF are formed on one surface of the first substrate SUB1.

Although not shown in FIGS. 4 and 5, the full-color display apparatus 3 further includes a scan line for inputting a scan signal to the first electrodes E1 and the second electrodes E2, a data line for inputting a data signal to the first electrodes E1 and the second electrodes E2, a power line connected to a power source, and so on, and may further include a plurality of sub-pixels SPXL1, SPXL2, and SPXL3 which are formed at regions where the first electrodes E1 and the second electrodes E2 are commonly formed. A predetermined number of sub-pixels SPXL1, SPXL2, and SPXL3 may constitute a single unit pixel UPXL.

The color filters CF that respectively correspond to the sub-pixels SPXL1, SPXL2, and SPXL3 may include a first color conversion region CF1 emitting a first color light (for example, red light R), a second color conversion region CF2 emitting a second color light (for example, green light G), and a third color conversion region CF3 emitting a third color light (for example, blue light B). Black matrices BM may be further formed between the first color conversion region CF1, the second color conversion region CF2, and third color conversion region CF3.

Like in the above-described embodiments of the present invention, when a predetermined voltage is applied to the first electrodes E1 and the second electrodes E2, blue light is emitted from the third color layer B and is absorbed in the first color conversion material and the second color conversion material of the first barrier ribs BR and the second barrier ribs BG, which are adjacent to lateral surfaces of the third color layer B. Then, the first color conversion material emits red light and the second color conversion material emits green light. Then, the red light and the green light are combined with the blue light emitted from the third color layer B such that the sub-pixels SPXL1, SPXL2, and SPXL3 may emit white light as a whole.

The white light is transmitted through the first color conversion region CF1, the second color conversion region CF2, and the third color conversion region CF3 (which correspond to the sub-pixels SPXL1, SPXL2, and SPXL3 of the color filters CF, respectively), such that red light R, green light G, and blue light B may be emitted from the first color conversion region CF1, the second color conversion region CF2, and the third color conversion region CF3, respectively. The color of the light emitted from a single unit pixel may be determined according to the gray level of the red light R, the green light G, and the blue light B. Thus, a full-color display apparatus may be embodied using a plurality of unit pixels.

FIGS. 4 and 5 show a bottom emission type light-emitting device, and thus, show a case where the color filters CF are formed on one surface of the first substrate SUB1. However, the present invention is not limited thereto. In a case of a top emission type light-emitting device, the color filters CF may be formed on one surface of the second substrate SUB2.

In addition, FIGS. 4 and 5 show a case where the color filters CF are formed on edge portions of the first substrate SUB1. However, FIGS. 4 and 5 show an example, and thus, the color filters CF may be formed between the first electrodes E1 and the first substrate SUB 1.

Hereinafter, a full-color display apparatus will be described with regard to a fourth embodiment of the present invention with reference to FIGS. 6 and 7.

Figure 6:
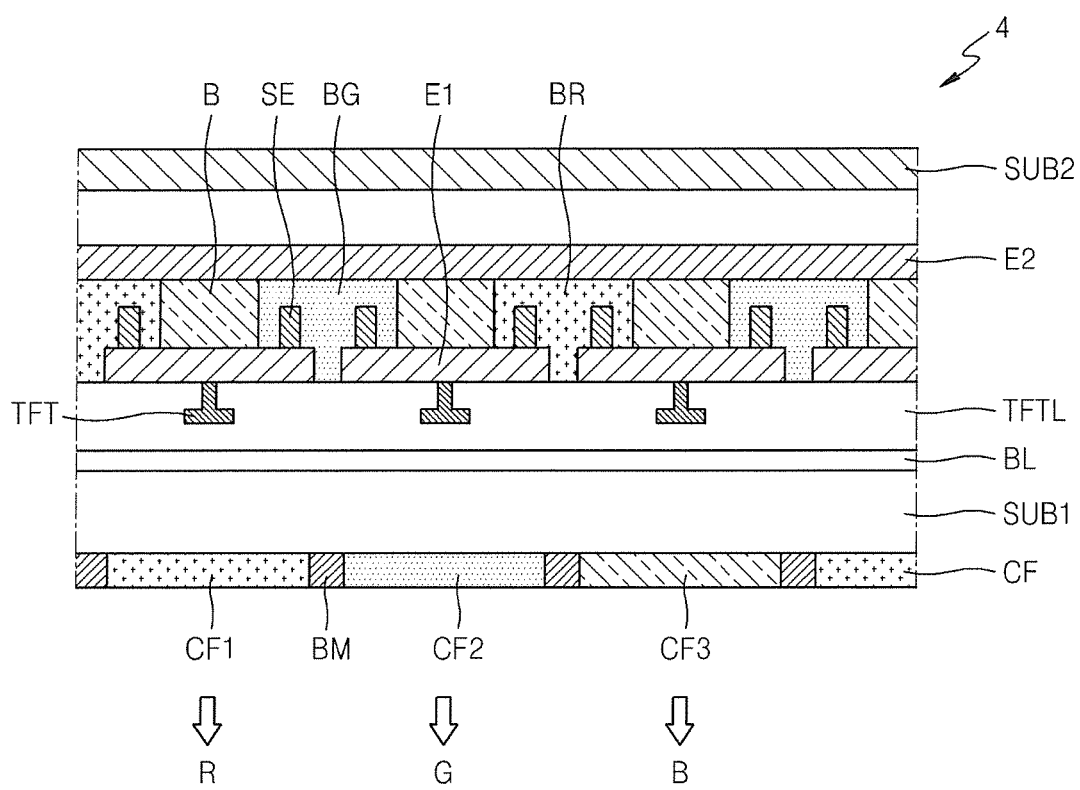
FIG. 6 is a cross-sectional view of a full-color display apparatus using an active matrix driving method, according to another embodiment of the present invention.

FIG. 6 is a cross-sectional view of a full-color display apparatus 4 using an active matrix driving method, according to a fourth embodiment of the present invention. FIG. 7 is a cross-sectional view of a portion of the full-color display apparatus 4 of FIG. 6.

Figure 7:
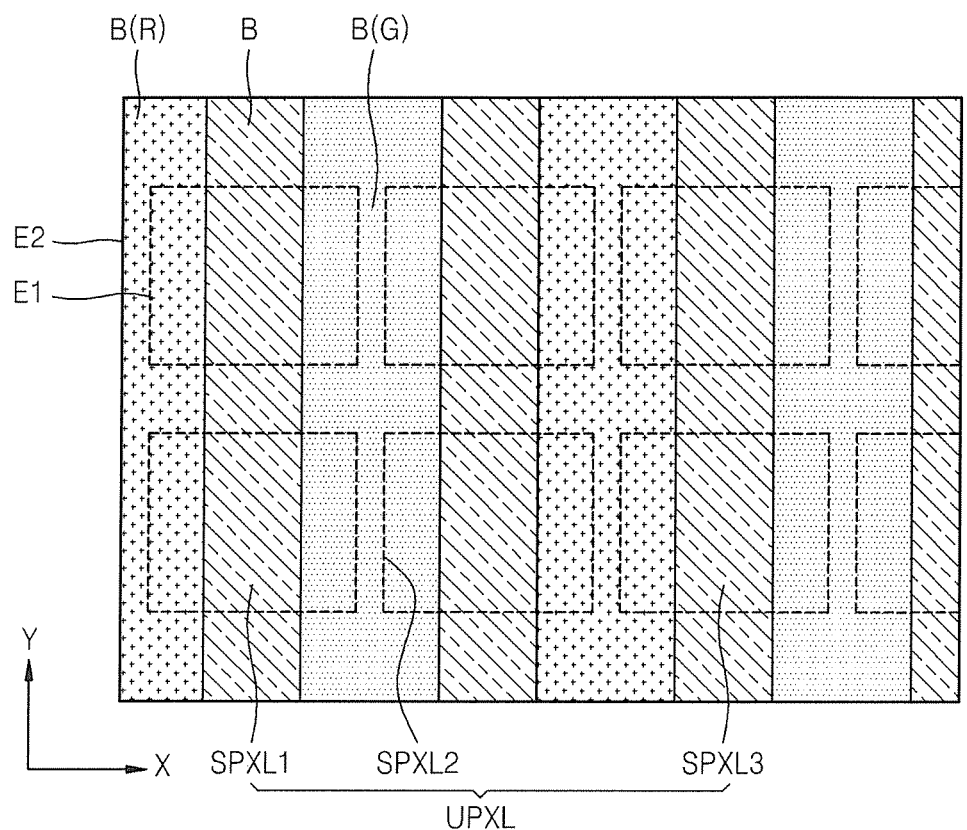
FIG. 7 is a cross-sectional view of a portion of the full-color display apparatus of FIG. 6.

Referring to FIGS. 6 and 7, the buffer layer BL is formed on the first substrate SUB1 and a plurality of first electrodes E1 are formed in island patterns on respective pixels of the buffer layer BL.

The second electrode E2 is formed as a common electrode on a plurality of pixels.

A thin film transistor layer TFTL, including a plurality of thin film transistors TFT, is formed on the buffer layer BL. The thin film transistors TFT, capacitors, and various wirings are formed on the thin film transistor layer TFTL. The first electrodes E1 formed on the respective pixels operate when receiving signals applied to the thin film transistors TFT.

The first barrier ribs BR (including the first color conversion material), the second barrier ribs BG (including the second color conversion material), and the third color layer B (disposed between the first barrier ribs BR and the second barrier ribs BG) are formed between the first electrode E1 and the second electrode E2.

The auxiliary electrodes SE are formed in the first barrier ribs BR and the second barrier ribs BG.

In addition, color filters CF are formed on one surface of the first substrate SUB1.

Although not shown in FIGS. 6 and 7, the full-color display apparatus 4 further includes a scan line for inputting a scan signal to the first electrodes E1 and the second electrodes E2, a data line for inputting a data signal to the first electrodes E1 and the second electrodes E2, a power line connected to a power source, and so on, and may further include a plurality of sub-pixels SPXL1, SPXL2, and SPXL3 which are formed at regions where the first electrodes E1 and the second electrodes E2 are commonly formed. A predetermined number of sub-pixels SPXL1, SPXL2, and SPXL3 may constitute a single unit pixel UPXL.

The color filters CF that respectively correspond to the sub-pixels SPXL1, SPXL2, and SPXL3 may include the first color conversion region CF1 emitting a first color light (for example, red light R), the second color conversion region CF2 emitting a second color light (for example, green light G), and the third color conversion region CF3 emitting a third color light (for example, blue light B). Black matrices BM may be further formed between the first color conversion region CF1, the second color conversion region CF2, and the third color conversion region CF3.

Like in the above-described embodiments of the present invention, when a predetermined voltage is applied to the first electrodes E1 and the second electrodes E2, blue light is emitted from the third color layer B and is absorbed in the first color conversion material and the second color conversion material of the first barrier ribs BR and the second barrier ribs BG, which are adjacent to lateral surfaces of the third color layer B. Then, the first color conversion material emits red light and the second color conversion material emits green light. Then, the red light and the green light combine with the blue light emitted from the third color layer B such that the sub-pixels SPXL1, SPXL2, and SPXL3 may emit white light as a whole.

The white light is transmitted through the first color conversion region CF1, the second color conversion region CF2, and the third color conversion region CF3 (which correspond to the sub-pixels SPXL1, SPXL2, and SPXL3 of the color filters CF, respectively), such that red light R, green light G, and blue light B may be emitted from the first color conversion region CF1, the second color conversion region CF2, and the third color conversion region CF3, respectively. The color of the light emitted from a single unit pixel may be determined according to the gray level of the red light R, the green light G, and the blue light B. Thus, a full-color display apparatus may be embodied by using a plurality of unit pixels.

FIGS. 6 and 7 show a bottom emission type light-emitting device, and thus, show a case where the color filters CF are formed on one surface of the first substrate SUB1. However, the present invention is not limited thereto. In a case of a top emission type light-emitting device, the color filters CF may be formed on one surface of the second substrate SUB2.

In addition, FIGS. 6 and 7 show a case where the color filters CF are formed on edge portions of the first substrate SUB1. However, FIGS. 6 and 7 show an example, and thus, the color filters CF may be formed between the first electrodes E1 and the first substrate SUB1.

According to the one or more embodiments of the present invention, a white light-emitting device may be manufactured using a simple manufacturing process, and the white light-emitting device has high power efficiency. A full-color display apparatus includes the white light-emitting device.

While the present invention has been illustrated and described with reference to certain exemplary embodiments, it will be understood by those of ordinary skill in the art that various changes may be made to the described embodiments without departing from the spirit and scope of the present invention as defined by the following claims.

What is claimed is:

1. A white light-emitting device comprising:
    a first electrode;
    a first barrier rib on the first electrode, the first barrier rib comprising a first color conversion material;
    a second barrier rib on the first electrode and spaced apart from the first barrier rib, the second barrier rib comprising a second color conversion material;
    an auxiliary electrode in each of the first barrier rib and the second barrier rib, the auxiliary electrode being connected to the first electrode;
    a third color layer between the first barrier rib and the second barrier rib, the third color layer configured to emit white light when light emitted from the third color layer is combined with light emitted from the first color conversion material and light emitted from the second color conversion material; and
    a second electrode on the first barrier rib, the second barrier rib, and the third color layer.

2. The white light-emitting device of claim 1, wherein when the first color conversion material and the second color conversion material absorb light emitted from the third color layer, the first color conversion material and the second color conversion material emit light having a wavelength range different from a wavelength range of the light emitted from the third color layer.

3. The white light-emitting device of claim 2, wherein the first color conversion material and the second color conversion material are configured to emit light having different wavelength ranges.

4. The white light-emitting device of claim 1, wherein at least one of the first color conversion material, the second color conversion material, or the third color layer comprises an organic light-emitting material.

5. The white light-emitting device of claim 1, wherein the third color layer is configured to emit light having a wavelength range of about 400 nm to about 500 mm.

6. The white light-emitting device of claim 1, wherein when the first color conversion material absorbs light emitted from the third color layer, the first color conversion material emits light having a wavelength range of about 450 nm to about 600 nm.

7. The white light-emitting device of claim 1, wherein when the second color conversion material absorbs light emitted from the third color layer, the second color conversion material emits light having a wavelength range of about 600 nm to about 700 nm.

8. The white light-emitting device of claim 1, wherein the first barrier rib comprises an insulating resin binder mixed with the first color conversion material, and the second bather rib comprises an insulating resin binder mixed with the second color conversion material.

9. The white light-emitting device of claim 1, wherein the auxiliary electrode comprises a material having a lower resistance than that of the first electrode.

10. The white light-emitting device of claim 1, wherein the auxiliary electrode comprises a dispersive metal particle.

11. The white light-emitting device of claim 1, wherein the auxiliary electrode is surrounded by the first barrier rib or the second barrier rib so as to be insulated from the second electrode.

12. A white light-emitting panel comprising:
    at least one white light-emitting device of claim 1 between a first substrate and a second substrate,
    wherein the first electrode of the white light-emitting device is formed in a plurality of patterns spaced apart from each other.

13. A display apparatus comprising:
    at least one white light-emitting device of claim 1 between a first substrate and a second substrate; and
    a plurality of color conversion regions on one surface of at least one of the first substrate or the second substrate, the plurality of color conversion regions being configured to convert white light emitted from the white light-emitting device into at least two colors.

14. The display apparatus of claim 13, wherein the first electrode comprises a plurality of stripes that extend in a first direction, the second electrode comprises a plurality of stripes that extend in a second direction that intersects the first direction, and the white light-emitting device is configured to be driven by a passive matrix method.

15. The display apparatus of claim 13, wherein the first electrode comprises island patterns connected to thin film transistors on respective pixels, the second electrode is a common electrode on a plurality of pixels, and the white light-emitting device is configured to be driven by an active matrix method.

16. The display apparatus of claim 13, wherein at least one of the first color conversion material, the second color conversion material, or the third color layer comprises an organic light-emitting material.

17. A method of manufacturing a white light-emitting panel, the method comprising:
    forming a first electrode on a first substrate;
    forming an auxiliary electrode on the first electrode;
    forming a first barrier rib and a second barrier rib on the first electrode, the first or second barrier rib covering the auxiliary electrode, wherein the first barrier rib comprises a first color conversion material and the second barrier rib comprises a second color conversion material;
    forming a third color layer between the first barrier rib and the second barrier rib, the third color layer being configured to emit white light when light emitted from the third color layer is combined with light emitted from the first color conversion material and light emitted from the second color conversion material; and
    forming a second electrode on the first barrier rib, the second barrier rib, and the third color layer.

18. The method of claim 17, wherein the forming the first electrode comprises printing etching pastes in a plurality of patterns spaced apart from each other on the substrate; forming a conductive layer between the printing etching pastes; and etching the printing etching pastes to form the first electrode in a plurality of patterns spaced apart from each other.

19. The method of claim 17, wherein the forming the first barrier rib comprises printing a material comprising a mixture of the first color conversion material and an insulating resin binder, and wherein forming the second barrier rib comprises printing a material comprising a mixture of the second color conversion material and an insulating resin binder.

20. The method of claim 17, wherein:
    the forming the first barrier rib comprises forming the first barrier rib such that when the first color conversion material absorbs light emitted from the third color layer, the first color conversion material emits light having a wavelength range different from that of the light emitted by the third color layer; and the forming the second barrier rib comprises forming the second barrier rib such that when the second color conversion material absorbs light emitted from the third color layer, the second color conversion material emits light having a wavelength range different from that of the light emitted by the third color layer.

21. The method of claim 17, wherein the forming the auxiliary electrode comprises printing a paste comprising a dispersive metal particle.

22. The method of claim 17, wherein at least one of the first color conversion material, the second color conversion material, or the third color layer comprises an organic light-emitting material.

* * * * *